(12) United States Patent
Zhao

(10) Patent No.: US 9,337,107 B2
(45) Date of Patent: May 10, 2016

(54) SEMICONDUCTOR DEVICE AND METHOD FOR FORMING THE SAME

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/609,520

(22) Filed: Jan. 30, 2015

(65) Prior Publication Data

US 2015/0214112 A1 Jul. 30, 2015

(30) Foreign Application Priority Data

Jan. 30, 2014 (CN) .......................... 2014 1 0045280

(51) Int. Cl.
*H01L 21/8238* (2006.01)
*H01L 27/092* (2006.01)
*H01L 29/51* (2006.01)

(52) U.S. Cl.
CPC .... *H01L 21/8238* (2013.01); *H01L 21/823842* (2013.01); *H01L 27/092* (2013.01); *H01L 29/511* (2013.01)

(58) Field of Classification Search
CPC ............... H01L 21/8238; H01L 21/823842; H01L 27/092; H01L 29/511
See application file for complete search history.

(56) References Cited

U.S. PATENT DOCUMENTS

| | | | |
|---|---|---|---|
| 2013/0270647 A1* | 10/2013 | Zhu | H01L 21/022 257/369 |
| 2015/0126023 A1* | 5/2015 | Choi | H01L 21/28158 438/591 |

* cited by examiner

*Primary Examiner* — Armando Rodriguez
(74) *Attorney, Agent, or Firm* — Anova Law Group, PLLC

(57) ABSTRACT

Various embodiments provide semiconductor devices and methods for forming the same. A substrate having a dielectric layer formed thereon is provided. The dielectric layer has six openings. A gate dielectric layer and a cap layer are sequentially formed in each opening of the six openings. A first work function layer is formed in a first opening and a second opening. A diffusion layer is formed in the first opening, a fifth opening, and a sixth opening. A material of the diffusion layer is diffused into the first work function layer and the cap layer, to form a doped work function layer in the first opening and a doped cap layer in the fifth opening and in the sixth opening. A second work function layer is formed in a fourth opening and the fifth opening. A third work function layer and a metal gate are formed in the each opening.

20 Claims, 3 Drawing Sheets

SEMICONDUCTOR DEVICE AND METHOD FOR FORMING THE SAME

CROSS-REFERENCES TO RELATED APPLICATIONS

This application claims priority to Chinese Patent Application No. CN201410045280.8, filed on Jan. 30, 2014, the entire content of which is incorporated herein by reference.

FIELD OF THE DISCLOSURE

The present disclosure relates to the field of semiconductor manufacturing technology and, more particularly, relates to semiconductor devices and methods for forming the same.

BACKGROUND

Complementary Metal-Oxide-Semiconductor (CMOS) device is one of basic semiconductor devices for forming integrated circuits. A CMOS device includes a P-type metal-oxide-semiconductor (PMOS) transistor and an N-type metal oxide semiconductor (NMOS) transistor.

In existing technology, in order to control short-channel effect at the same time of reducing gate size, high-K dielectric materials are used for replacing conventional materials such as silicon oxide and the like, as a gate dielectric layer of a transistor. Further, metal materials are used for replacing conventional materials such as polysilicon and the like, as a gate electrode layer of the transistor. Moreover, in existing technology, in order to adjust threshold voltages of the PMOS transistor and the NMOS transistor, work function layers are formed on the surface of the gate dielectric layers of the PMOS transistor and the NMOS transistor. The work function layer of the PMOS transistor needs to have a sufficiently high work function, whereas the work function layer of the NMOS transistor needs to have a sufficiently low work function. Therefore, for the PMOS transistor and the NMOS transistor, the work function layer is made of different materials, in order to meet the respective requirements for tuning the work functions.

In existing technology, during the forming of a CMOS device, a dummy gate layer is respectively formed on a surface of a semiconductor substrate at a region for forming a PMOS transistor and at a region for forming an NMOS transistor. After a source region and a drain region are formed using the dummy gate layer as a mask, a dielectric layer leveled with a surface of the dummy gate layer is formed on the surface of the semiconductor substrate. After the dielectric layer is formed, the dummy gate layer at the PMOS region or the NMOS region is removed, to form an opening in the dielectric layer. Further, a gate dielectric layer, a work function layer, and a gate electrode layer are sequentially deposited in the opening.

In such a process, the gate electrode layer is made of a metal. The gate dielectric layer is made of a high-K material. Such a method for forming a CMOS device is a gate-last process used for forming a high-K metal gate (HKMG). Moreover, the material of the work function layer formed at the PMOS region is different from the material of the work function layer formed at the NMOS region.

However, the existing process for forming transistors with multiple threshold voltages is often too complicated, and requires a high production cost with low production efficiency.

BRIEF SUMMARY OF THE DISCLOSURE

One aspect of the present disclosure includes methods for forming a semiconductor device. In an exemplary method, a substrate can be provided. A dielectric layer can be formed on the substrate. The dielectric layer can have therein six openings. The six openings can include a first opening, a second opening, a third opening, a fourth opening, a fifth opening, and a sixth opening. A gate dielectric layer can be formed on sidewalls and a bottom surface of each opening of the six openings. A cap layer can be formed on the gate dielectric layer. A first work function layer can be formed on the cap layer in the first opening and in the second opening. A diffusion layer can be formed on the first work function layer in the first opening, and on the cap layer in both of the fifth opening and the six opening. An annealing process can be performed to diffuse a material of the diffusion layer into the first work function layer and the cap layer, to form a doped work function layer in the first opening and form a doped cap layer in the fifth opening and in the sixth opening. A remaining portion of the diffusion layer can be removed after the annealing process. A second work function layer can be formed on the cap layer in the fourth opening and on the doped cap layer in the fifth opening, such that transistors respectively formed with the first opening, the second opening, and the third opening can have threshold voltages different from each other, and transistors respectively formed with the fourth opening, the fifth opening, and the sixth opening can have threshold voltages different from each other. After the second work function layer is formed, a third work function layer can be formed in the each opening. A metal gate can be formed on the third work function layer.

Another aspect of the present disclosure includes semiconductor devices. An exemplary device can include a substrate and a dielectric layer on the substrate. The dielectric layer can have therein six openings. The six openings can include a first opening, a second opening, a third opening, a fourth opening, a fifth opening, and a sixth opening. The device can further include a gate dielectric layer on sidewalls and a bottom surface of each opening of the six openings. Within the first opening, the device can include a cap layer on the gate dielectric layer, a doped work function layer on the cap layer, and a third work function layer on the doped work function layer. The doped work function layer can have a dopant material therein. Within the second opening, the device can include the cap layer on the gate dielectric layer, a first work function layer on the cap layer, and the third work function layer on the first work function layer. Within the third opening, the device can include the cap layer on the gate dielectric layer, and the third work function layer on the cap layer, such that transistors respectively formed with the first opening, the second opening, and the third opening have threshold voltages different from each other. Within the fourth opening, the device can include the cap layer on the gate dielectric layer, a second work function layer on the cap layer, and the third work function layer on the second work function layer. Within the fifth opening, the device can include a doped cap layer on the gate dielectric layer, the second work function layer on the doped cap layer, and the third work function layer on the second work function layer. The doped cap layer can have the dopant material therein. Within the sixth opening, the device can include the doped cap layer on the gate dielectric layer, and the third work function layer on the doped cap layer, such that transistors respectively formed with the fourth opening, the fifth opening, and the sixth opening can have threshold voltages different from each other. Further, the device can include a metal gate filling the each opening of the six openings.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Existing processes for forming transistors with multiple threshold voltages are often too complicated with a high production cost and low production efficiency.

Figure 1:
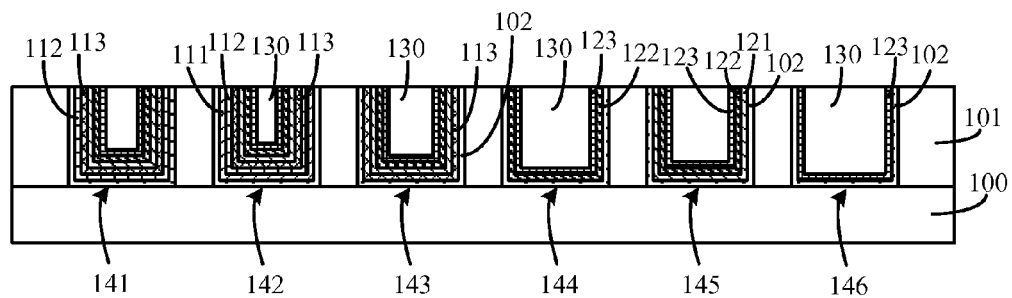
FIG. 1 depicts a cross-sectional view of transistors with multiple threshold voltages.

FIG. 1 depicts a cross-sectional view of transistors with multiple threshold voltages. Referring to FIG. 1, the transistors with multiple threshold voltages can include a substrate 100 and a dielectric layer 101 on the surface of the substrate 100. The dielectric layer 101 can have six openings including a first opening, a second opening, a third opening, a fourth opening, a fifth opening, and a sixth opening. A gate dielectric layer 102 can be on sidewalls and a bottom surface of each of the first opening, the second opening, the third opening, the fourth opening, the fifth opening, and the sixth opening.

Each opening of the six openings can have one or more work function layers sequentially formed on the gate dielectric layer 102, and a metal gate 130 formed on a top work function layer of the one or more work function layers. The gate dielectric layer 102, the metal gate 130, and the one or more work function layers sandwiched between the gate dielectric layer 102 and the metal gate 130 can form a gate structure in each opening. As shown in FIG. 1, the first opening, the second opening, the third opening, the fourth opening, the fifth opening, and the sixth opening can have therein a gate structure 141, a gate structure 142, a gate structure 143, a gate structure 144, a gate structure 145, and a gate structure 146, respectively.

The first opening can have, within the first opening and sequentially from the surface of the gate dielectric layer 102 toward the top of the first opening, a second P-type work function layer 112, a third P-type work function layer 113, a first N-type work function layer 121, a second N-type work function layer 122, a third N-type work function layer 123, and a metal gate 130.

The second opening can have, within the second opening and sequentially from the surface of the gate dielectric layer 102 toward the top of the second opening, a first P-type work function layer 111, the second P-type work function layer 112, the third P-type work function layer 113, the first N-type work function layer 121, the second N-type work function layer 122, the third N-type work function layer 123, and the metal gate 130.

The third opening can have, within the third opening and sequentially from the surface of the gate dielectric layer 102 toward the top of the third opening, the third P-type work function layer 113, the first N-type work function layer 121, the second N-type work function layer 122, the third N-type work function layer 123, and the metal gate 130.

The fourth opening can have, within the fourth opening and sequentially from the surface of the gate dielectric layer 102 toward the top of the fourth opening, the second N-type work function layer 122, the third N-type work function layer 123, and the metal gate 130.

The fifth opening can have, within the fifth opening and sequentially from the surface of the gate dielectric layer 102 toward the top of the fifth opening, the first N-type work function layer 121, the second N-type work function layer 122, the third N-type work function layer 123, and the metal gate 130.

The sixth opening can have, within the sixth opening and sequentially from the surface of the gate dielectric layer 102 toward the top of the sixth opening, the third N-type work function layer 123 and the metal gate 130.

Gate structures in the first opening, the second opening, and the third opening can be used for forming PMOS transistors. Gate structures in the fourth opening, the fifth opening, and the sixth opening can be used for forming NMOS transistors.

Compared with the first opening, the second opening additionally has the first P-type work function layer 111. A PMOS transistor formed using the second opening can have a higher threshold voltage than a PMOS transistor formed using the first opening.

Compared with the third opening, the first opening additionally has the second P-type work function layer 112. The PMOS transistor formed using the first opening can have a higher threshold voltage than a PMOS transistor formed using the third opening.

Compared with the fourth opening, the fifth opening additionally has the first N-type work function layer 121. An NMOS transistor formed using the fifth opening can have a higher threshold voltage than a PMOS transistor formed using the fourth opening.

Compared with the sixth opening, the fourth opening additionally has the second N-type work function layer 122. The NMOS transistor formed using the fourth opening can have a higher threshold voltage than a PMOS transistor formed using the sixth opening.

Thus, the three PMOS transistors can have different threshold voltages. The three NMOS transistors can have different threshold voltages.

However, a process for forming the semiconductor device as shown in FIG. 1 is complicated. For example, because the first opening does not have therein the first P-type work function layer 111, after the first P-type work function layer 111 is deposited in the six openings, a first mask needs to be formed to expose the first opening in order to etch and remove the first P-type work function layer 111 in the first opening.

Further, because the third opening does not have therein both of the first P-type work function layer 111 and the second P-type work function layer 112, after the first P-type work function layer 111 therein, after the second P-type work function layer 112 deposited in the six openings, a second mask needs to be formed to expose the third opening in order to etch and remove the first P-type work function layer 111 and the second P-type work function layer 112 in the third opening.

Further, because each of the fourth opening, the fifth opening and the sixth opening does not have therein any of the first P-type work function layer 111, the second P-type work function layer 112, and the third P-type work function layer 113, after the third P-type work function layer 113 is deposited in the six openings, a third mask needs to be formed to expose the fourth opening, the fifth opening, and the sixth opening, in order to etch and remove the first P-type work function layer 111, the second P-type work function layer 112, and the third P-type work function layer 113 in the fourth opening, the fifth opening and the sixth opening.

Further, because the fourth opening does not have therein the first N-type work function layer 121. After the first N-type work function layer 121 is deposited in the six openings, a fourth mask needs to be formed to expose the fourth opening, in order to etch and remove the first N-type work function layer 121 in the fourth opening.

Still further, because the sixth opening does not have therein both of the first N-type work function layer 121 and the second N-type work function layer 122, after the second N-type work function layer 122 is deposited in the six openings, a fifth mask needs to be formed to expose the sixth opening, in order to etch and remove the first N-type work function layer 121 and the second N-type work function layer 122 in the sixth opening.

Therefore, in a process for forming the semiconductor device as shown in FIG. 1, five processes for forming and removing a mask layer need to be performed. Thus, the process for forming the semiconductor device is complicated with low production efficiency, and has relatively high production cost. In the above example as shown in FIG. 1, when the first mask layer, the second mask layer, the third mask layer, the fourth mask layer, and the fifth layer are all patterned photoresist layers, five photolithography processes and five processes for removing a photoresist need to be performed. As a result, the process for forming the semiconductor device as shown in FIG. 1 is complicated.

To solve the above problem and other problems, the present disclosure provides semiconductor devices and methods forming the same. In an exemplary method, a first work function layer can be formed on a surface of a cap layer in both of a first opening and a second opening. The cap layer can have the same work function type as the first work function layer.

Further, a diffusion layer can be formed on a surface of the first work function layer in the first opening. Using an annealing process, a material of the diffusion layer can be diffused into the first work function layer to form a doped work function layer. Because the diffusion layer can have a work function type opposite to the work function type of the first work function layer, a transistor formed in the first opening can have a threshold voltage higher than a threshold voltage of a transistor formed in the second opening.

Further, in the third opening, only a third work function layer is formed between a cap layer and a metal gate. Thus, compared with the third opening, the first opening can additionally have the doped work function layer. Therefore, a transistor formed in the third opening can have a threshold voltage higher than the threshold voltage of the transistor formed in the first opening. That is, each of the transistors formed in the first opening, the second opening, and the third opening can respectively have a different threshold voltage. In other words, the transistors formed in the first opening, the second opening, and the third opening can have threshold voltages different from each other.

Still further, the diffusion layer can be formed on the surface of the cap layer formed in the fifth opening and the sixth opening. Using an annealing process, a material of the diffusion layer can be diffused into the cap layer to form a doped cap layer in the fifth opening and the sixth opening. Because the diffusion layer can have a work function type opposite to the work function type of the first work function layer, the cap layer can have a work function type opposite to the work function type of the doped cap layer. Thus, a transistor formed in the fourth opening can have a threshold voltage higher than a threshold voltage of a transistor formed in the fifth opening.

Compared with the sixth opening, both of the fourth opening and the fifth opening can further have a second work function layer, each of the transistors formed in the fourth opening and the fifth opening can have a threshold voltage higher than a transistor formed in the fourth opening and the fifth opening can have a threshold voltage higher than a threshold voltage of a transistor formed in the sixth opening. Therefore, each of the transistors formed in the fourth opening, the fifth opening, and the sixth opening can respectively have a different threshold voltage.

Because only three photolithography-and-etching processes need to be performed, during the formation of the first work function layer, the diffusion layer, and the second work function layer, the process for forming the semiconductor device can be simplified. Further, at most only three work function layers need to be deposited in the first opening, the second opening, the third opening, the fourth opening, the fifth opening, and the sixth opening. Therefore, the number of work function layers that need to be deposited in the openings can be sufficiently small, such that the process for filling the six openings can be easier to perform, which can help to prevent gaps or voids from forming in the work function layers and the metal gate in the six openings. Thus, performance and stability of the semiconductor device can be improved.

Figure 7:
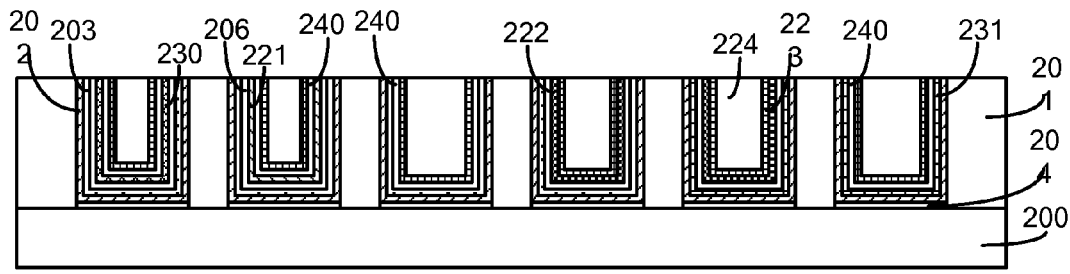
Figure 8:
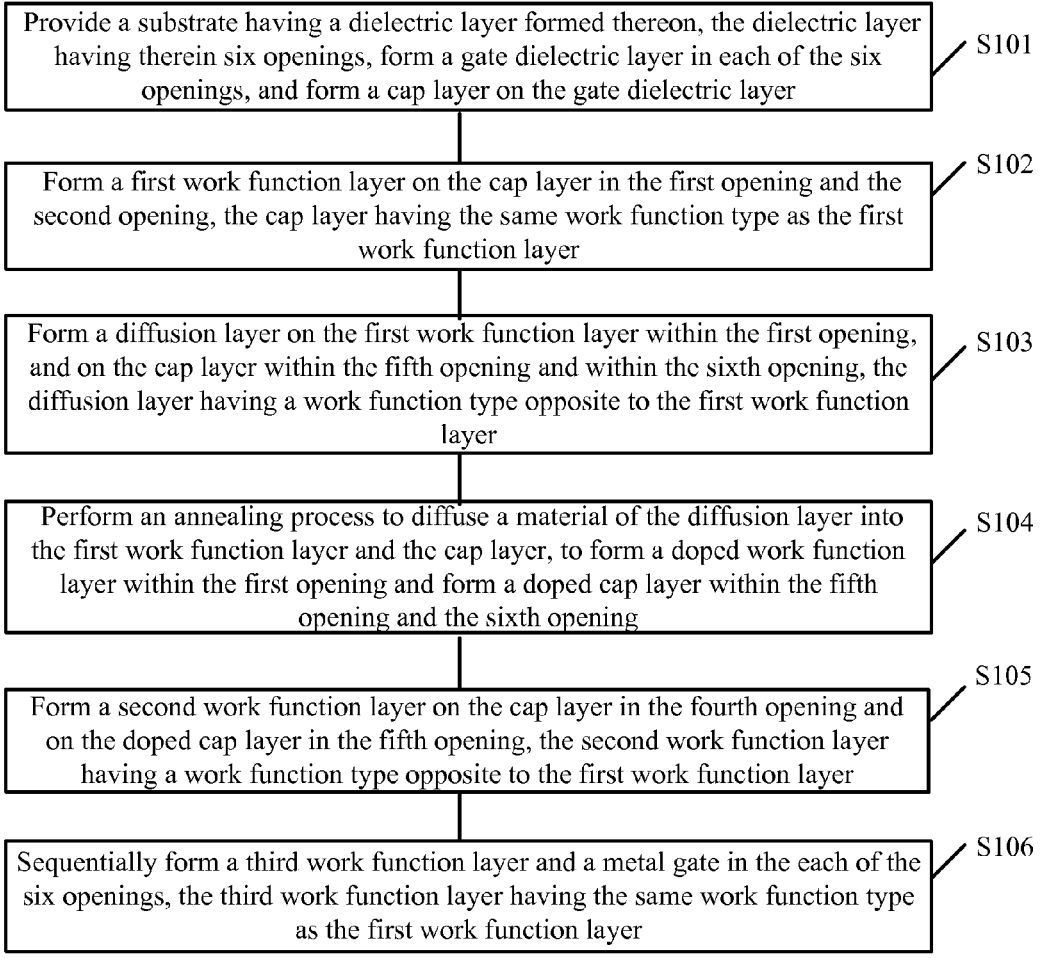
FIG. 8 depicts a flow diagram of an exemplary method for forming a semiconductor device in accordance with various disclosed embodiments.

FIG. 8 depicts a flow diagram of an exemplary method for forming a semiconductor device in accordance with various disclosed embodiments. FIGS. 2-7 depict cross-sectional views of a semiconductor device at various stages during a fabrication process in accordance with various disclosed embodiments. Note that although FIGS. 2-7 depict semiconductor devices corresponding to the method depicted in FIG. 8, the semiconductor devices and the methods are not limited to one another in any manner.

Figure 2:
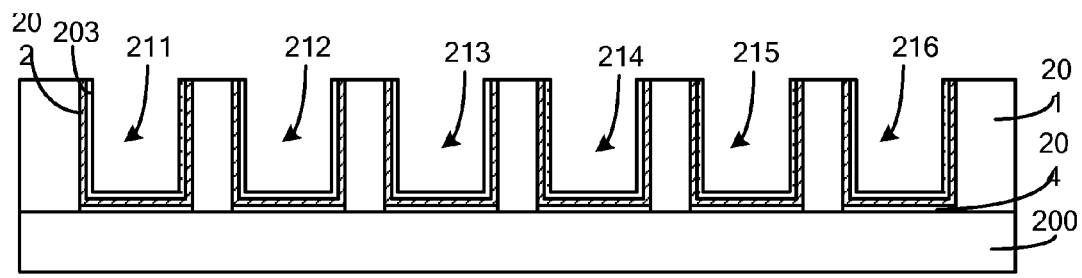
FIGS. 2-7 depict cross-sectional views of an exemplary semiconductor device at various stages during a fabrication process in accordance with various disclosed embodiments.

In Step S101 of FIG. 8 and referring to FIG. 2, a substrate 200 is provided. A surface of the substrate 200 has a dielectric layer 201 formed thereon. The dielectric layer 201 has six openings formed therein, including a first opening 211, a second opening 212, a third opening 213, a fourth opening 214, a fifth opening 215, and a sixth opening 216. A gate dielectric layer 202 can be formed on sidewall(s) and bottom surface of each of the first opening 211, the second opening 212, the third opening 213, the fourth opening 214, the fifth opening 215, and the sixth opening 216. A cap layer 203 can be formed on the surface of the gate dielectric layer 202. Transistors formed using the first opening 211, the second opening 212, and the third opening 213 can have a type opposite to the type of transistors formed by the fourth opening 214, the fifth opening 215 and the sixth opening 216.

The surface of the substrate 200 can be used for forming a high-K metal gate (HKMG) transistor. The high-K metal gate transistor can be formed using a gate-last process. Therefore, a dummy gate structure for replacing a high-K metal gate structure, as well as a dielectric layer 201 for isolating the dummy gate structure, may need to be first formed on the surface of the substrate 200. The dummy gate structure can then be removed, such that an opening for forming a gate structure of the transistor can be formed in the dielectric layer 201.

In one embodiment, the substrate 200 can include a planar base or a planar substrate. The dielectric layer 201, the first opening 211, the second opening 212, the third opening 213, the fourth opening 214, the fifth opening 215, and the sixth opening 216 can be located on a surface of the planar base. The planar base can be a bulk substrate. The bulk substrate can include a silicon substrate, a silicon-germanium substrate, a silicon carbide substrate, a silicon-on-insulator (SOI)

substrates, a germanium-on-insulator (GOI) substrate, a glass substrate, and/or a Group III-V compound substrate including, e.g., silicon nitride, gallium arsenide, and/or the like.

In another embodiment, the substrate 200 can include a base or a substrate, fins located on a surface of the base, and an insulating layer located on the surface of the base and covering a portion of sidewalls of the fins. The dielectric layer can be located on the surface of the insulating layer and on the sidewalls and top surface(s) of the fins. The first opening, the second opening, the third opening, the fourth opening, the fifth opening and the sixth opening can extend across or cover across the surfaces of the fins, and can expose the tops (or the top surfaces) and a portion of the sidewalls of the fins. In this case, each of the six openings may have a rectangular shape, or any other appropriate shapes, without limitation.

In one embodiment, the base and the fins can be a portion of a bulk substrate. The fins can be formed by etching the bulk substrate. The portion of the bulk substrate that is not previously etched can be the base. In another embodiment, the base can be a bulk substrate. A process for forming the fin(s) can include the following. A semiconductor layer can be formed on a surface of the bulk substrate using a selective epitaxial deposition process. The semiconductor layer can be etched until the bulk substrate is exposed, to form the fin(s).

In one embodiment, the substrate 200 can have a first region and a second region. The first region can be used for forming a PMOS transistor. The second region can be used for forming an NMOS transistor. The first opening 211, the second opening 212, and the third opening 213 can be formed at the first region. Subsequently, gate structures respectively formed within the first opening 211, the second opening 212, and the third opening 213 can be used for forming PMOS transistors. The fourth opening 214, the fifth opening 215, and the sixth opening 216 can be formed at the second region. Subsequently, gate structures respectively formed within the fourth opening 214, the fifth opening 215, and the sixth opening 216 can be used for forming NMOS transistors.

A process for forming the first opening 211, the second opening 212, the third opening 213, the fourth opening 214, the fifth opening 215 and the sixth opening 216 can include the following exemplary steps. Dummy gate structure(s) can be formed on the surface of the substrate 200. The dummy gate structure can include a dummy gate dielectric layer on the surface of the substrate 200, and a dummy gate layer on a surface of the dummy gate dielectric layer. The dummy gate dielectric layer can be made of a material including silicon oxide. The dummy gate layer can be made of a material including polysilicon. The dielectric layer 201 can be formed on the surface of the substrate 200. The dielectric layer 201 can have a surface leveled or coplanar with a surface of the dummy gate layer. The dummy gate layer can be removed, to form the first opening 211, the second opening 212, the third opening 213, the fourth opening 214, the fifth opening 215, and the sixth opening 216 within the dielectric layer 201.

A process for removing the dummy gate layer can include a dry etching process and/or a wet etching process. Because the dummy gate layer and the substrate 200 have the dummy gate dielectric layer there-between for separation, during the removing of the dummy gate layer, damages to the surface of the substrate 200 can be sufficiently small. Moreover, the dummy gate dielectric layer can be made of a material including silicon oxide, so a process for removing the dummy gate dielectric layer can have sufficiently small damage to the surface of the substrate 200.

The dummy gate structure can further include sidewall spacers on the surface of the substrate 200 at both sides of both of the dummy gate layer and the dummy gate dielectric layer. The sidewall spacer can be made of a material including silicon oxide, silicon nitride, silicon oxynitride, or a combination thereof. The sidewall spacers can define positions of a source region and a drain region to be formed in the substrate 200 at both sides of the dummy gate structure using an ion implantation process.

In certain embodiments, a source region can refer to a region that a source (or source electrode) is located. A drain region can refer to a region that a drain (or drain electrode) is located. The source and the drain can be formed in the substrate using the dummy gate structure as a mask. The dielectric layer 201 having a surface leveled or coplanar with the surface of the dummy gate structure can be formed on the surface of the substrate 200.

In one embodiment, a bonding layer 204 can further be formed between the gate dielectric layer 202 and the substrate 200. The bonding layer 204 can be used for enhancing bonding capability between the gate dielectric layer 202 (formed using, e.g., a high-K dielectric material) and the substrate 200. The bonding layer 204 can be made of a material including silicon oxide and/or silicon oxynitride. The bonding layer 204 can have a thickness ranging from about 5 Å to about 10 Å. For example, a process for forming the bonding layer 204 can include a thermal oxidation process, a chemical oxidation process, a chemical vapor deposition (CVD) process, a physical vapor deposition (PVD) process, and/or an atomic layer deposition (ALD) process.

In one embodiment, after the dummy gate layer is removed, the dummy gate dielectric layer can be removed and the surface of the substrate 200 can be exposed. Subsequently, the bonding layer 204 can be formed at the bottom of the first opening 211, the second opening 212, the third opening 213, the fourth opening 214, the fifth opening 215, and the sixth opening 216. In another embodiment, after the dummy gate layer is removed, the dummy gate dielectric layer can be retained. The dummy gate dielectric layer can be used as the bonding layer 204.

The gate dielectric layer 202 can be made of a high-K dielectric material. That is, a subsequently-formed transistor can be a high-K metal gate transistor. For example, the high-K dielectric material can include $La_2O_3$, $Al_2O_3$, $BaZrO$, $HfZrO_4$, $HfZrON$, $HfLaO$, $HfSiO$, $HfSiON$, $LaSiO$, $AlSiO$, $HfTaO$, $HfTiO$, $(Ba,Sr)TiO_3$, $Si_3N_4$, or a combination thereof. The gate dielectric layer 202 can have a thickness ranging from about 10 Å to about 30 Å. A process for forming the gate dielectric layer 202 can include a CVD process, a PVD process, and/or an ALD process.

The cap layer 203 can be used for separating a subsequently-formed work function layer from the gate dielectric layer 202, to prevent material of the work function layer and/or a (subsequently-formed) metal gate from diffusing into the gate dielectric layer 202. Thus, electrical isolation of the gate dielectric layer 202 can be improved, leakage current can be reduced, and stability of the formed transistors can be improved. The cap layer 203 can be made of a material including $La_2O_3$, $AL_2O_3$, $Ga_2O_3$, $In_2O_3$, MoO, Pt, Ru, TaCNO, Ir, TaC, MoN, WN, $Ti_xN_{1-x}$, or a combination thereof. The cap layer 203 can have a thickness ranging from about 5 Å to about 20 Å. A process for forming the cap layer 203 can include a CVD process, a PVD process, and/or an ALD process.

Figure 3:
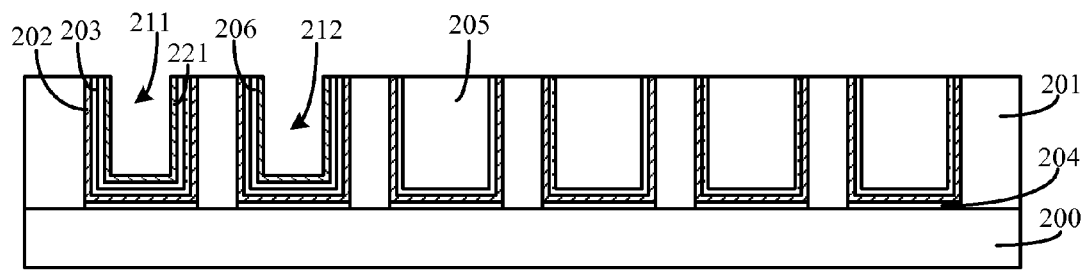

In Step S102 of FIG. 8 and referring to FIG. 3, a first work function layer 221 is formed on the surface of the cap layer 203 in both of the first opening 211 and the second opening 212. The cap layer 203 can have a work function type that is the same as a work function type of the first work function layer 221.

In one embodiment, gate structures respectively formed within the first opening 211, the second opening 212, and the third opening 213 can be used for forming PMOS transistors. In that case, the first work function layer 221 can be made of a P-type work function material. For example, the first work function layer 221 can be made of a material, i.e., a P-type work function material, including $Ti_xN_{1-x}$, TaC, MoN, and/or TaN. The first work function layer 221 can have a thickness ranging from about 10 Å to about 580 Å.

A process for forming the first work function layer 221 can include the following. A first sacrificial layer 205 can be formed in the third opening 213 (as shown in FIG. 2), the fourth opening 214 (as shown in FIG. 2), the fifth opening 215 (as shown in FIG. 2), and the sixth opening 216 (as shown in FIG. 2). A first work function film can be deposited on the surface of each of the first sacrificial layer 205 and the dielectric layer 201, and in the first opening 211 and the second opening 212. The first work function film on the surface of each of the first sacrificial layer 205 and the dielectric layer 201 can be removed using a planarization process, to form the first work function layer 221.

For example, a process for forming the first work function film can include a CVD process, a PVD process, and/or an ALD process. The planarization process can include a chemical mechanical polishing (CMP) process, an etch-back process, or any other appropriate polishing processes.

The first sacrificial layer 205 together with the dielectric layer 201 can serve as a mask for forming a first work function layer. In one embodiment, the first sacrificial layer 205 can be made of a material including a photoresist. For example, a process for forming the first sacrificial layer 205 can include the following. By using a coating process, a photoresist film can be formed on the surface of the dielectric layer 201 and in the first opening 211, the second opening 212, the third opening 213, the fourth opening 214, the fifth opening 215, and the sixth opening 216. An exposure and developing process can be performed on the photoresist film, to remove the photoresist film in the first opening 211 and the second opening 212. The first sacrificial layer 205 is thus formed in the third opening 213, the fourth opening 214, the fifth opening 215, and the sixth opening 216.

When a photoresist is used as the material of the first sacrifice layer 205, the first sacrificial layer 205 can be formed easily and patterned easily. Further, during the forming of the first sacrificial layer 205 by patterning, damage is not caused to the dielectric layer 201 or to the cap layer 203 within the first opening 211 and within the second opening 212.

In one embodiment, before the first work function layer 221 is formed, a first barrier layer 206 can be formed on the cap layer 203 within the first opening 211 and within the second opening 212. The first work function layer 221 can be formed on the surface of the first barrier layer 206 within the first opening 211 and within the second opening 212.

During the removing of the first work function film on the surface of the first sacrificial layer 205 and the dielectric layer 201 using the planarization process, the first barrier layer 206 can serve as a stop layer for the etching process or the polishing process, in order to protect the surface of the dielectric layer 201 from being damaged. Thus, accurate and precise sizes of the gate structures formed in the first opening 211, the second opening 212, the third opening 213, the fourth opening 214, the fifth opening 215, and the sixth opening 216 can be ensured.

The first barrier layer 206 can be made of a material including TaN, Ta, and/or TaAl. The first barrier layer 206 can have a thickness ranging from about 5 Å to about 20 Å. A process for forming the first barrier layer 206 can include a CVD process, a PVD process, and/or an ALD process.

Figure 4:
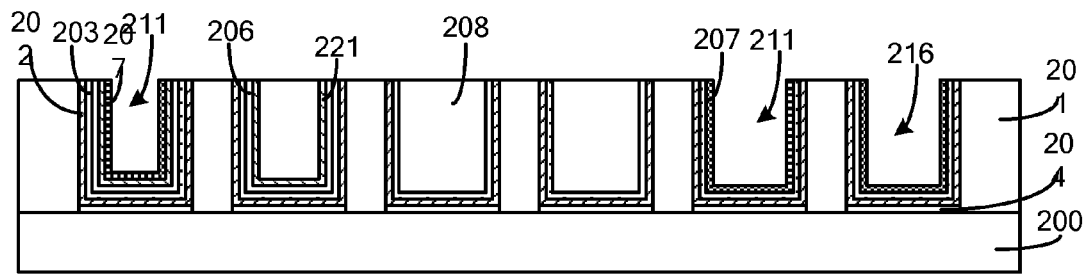

In Step S103 of FIG. 8 and referring to FIG. 4, after the polishing or planarization process, the first sacrificial layer 205 (as shown in FIG. 3) is removed. A diffusion layer 207 can be formed on the surface of the first work function layer 221 within the first opening 211, and on the surface of the cap layer 203 within the fifth opening 215 and within the sixth opening 216. The diffusion layer 207 can have a work function type opposite to a work function type of the first work function layer 221.

The diffusion layer 207 can be used for respectively altering the work function of the first work function layer 221 within the first opening 211, and the cap layer 203 within the fifth opening 215 and within the sixth opening 216. By diffusing the material of the diffusion layer 207 into the first work function layer 221 and the cap layer 203, a doped work function layer subsequently formed in the first opening 211 can be made different from the first work function layer 221 within the second opening 212. Thus, a transistor formed using the first opening 211 and a transistor formed using the second opening 212 can have different threshold voltages from each other. Accordingly, a transistor formed using the fifth opening 215 and a transistor formed using the fourth opening 214 can have different threshold voltages from each other. Therefore, PMOS transistors having different or various threshold voltages and NMOS transistors having different or various threshold voltages can be formed on the surface of the substrate 200.

In one embodiment, the first work function layer 221 can be made of a P-type work function material. The diffusion layer 207 can be made of an N-type work function material. Thus, a PMOS transistor formed using the first opening 211 can have a threshold voltage higher than a threshold voltage of a PMOS transistor formed using the second opening 212.

A process for forming the diffusion layer 207 can include the following. A second sacrificial layer 208 can be formed in the second opening 212, the third opening 213, and the fourth opening 214. A diffusion film can be deposited on the surface of the second sacrificial layer 208 and of the dielectric layer 201, and within the first opening 211, the fifth opening 215, and the sixth opening 216. The diffusion film on the surface of the second sacrificial layer 208 and of the dielectric layer 201 can be removed using a polishing or planarization process, to form the diffusion layer 207.

In one embodiment, the diffusion layer 207 can be made of a material including TiAl and/or Al. The diffusion layer 207 can have a thickness ranging from about 5 Å to about 30 Å. A process for forming the diffusion film can include a CVD process, a PVD process, and/or an ALD process.

The second sacrificial layer 208 together with the dielectric layer 201 can serve as a mask for forming the diffusion layer 207. In one embodiment, the second sacrificial layer 208 can be made of a material including a photoresist. For example, a process for forming the second sacrificial layer 208 can include the following. By using a coating process, a photoresist film can be formed on the surface of the dielectric layer 201 and within the first opening 211, the second opening 212, the third opening 213, the fourth opening 214, the fifth opening 215, and the sixth opening 216. An exposure and developing process can be performed on the photoresist film, to remove the photoresist film in the first opening 211, the fifth opening 215, and the sixth opening 216.

Further, in one embodiment, because the first sacrificial layer 205 (referring to FIG. 3) can be made of a photoresist, a process for removing the first sacrificial layer 205 can include a dry etching process and/or a wet etching process. Because the photoresist can be removed easily, the removing of the first sacrificial layer 205 may not easily cause damage to the cap layer 203 within the third opening 213, the fourth opening 214, the fifth opening 215, and the sixth opening 216. Further, the removing of the first sacrificial layer 205 may not easily generate residues attached thereto.

Figure 5:
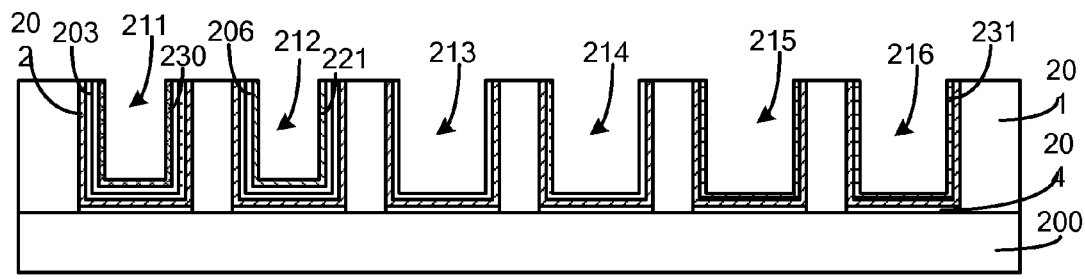

In Step S104 of FIG. 8 and referring to FIG. 5, after the polishing or planarization process, the second sacrificial layer 208 is removed (as shown in FIG. 4). An annealing process can be performed, to cause the material of the diffusion layer 207 (as shown in FIG. 4) to diffuse into the first work function layer 221 and the cap layer 203, to form a doped work function layer 230 within the first opening 211 and form a doped cap layer 231 within the fifth opening 215 and the sixth opening 216.

The annealing process can be used for causing the material in the diffusion layer 207 to diffuse into the first work function layer 221 within the first opening 211, and into the cap layer 203 in the fifth opening 215 and in the sixth opening 216, such that the work function of the first work function layer 221 within the first opening 211, and the work function of the cap layer 203 in the fifth opening 215 and in the sixth opening 216 can be altered.

In one embodiment, the diffusion layer 207 can be made of an N-type work function material. The first work function layer 221 can be made of a P-type work function material. Therefore, the doped work function layer 230 can have a lower work function compared with the first work function layer 221, such that a transistor formed in the first opening 211 can have a threshold voltage higher than a threshold voltage of a transistor formed in the second opening 212.

The annealing process can be performed for a time duration ranging from about 10 seconds to about 30 seconds, at a temperature (i.e., an annealing temperature) ranging from about 500° C. to about 800° C., and using a gas including nitrogen. In one embodiment, because the diffusion layer 207 can be made of a material including TiAl and/or Al, the annealing temperature may need to be higher than a melting point of TiAl and/or Al, to ensure that the material of the diffusion layer 207 can diffuse.

After the annealing process is performed, a remaining portion of the diffusion layer 207 can exist on the surface of the doped work function layer 230 and the doped cap layer 231. Such a remaining portion of the diffusion layer 207 may need to be removed for subsequent processes to be performed. A process for removing the diffusion layer 207 can include a dry etching process and/or a wet etching process.

Further, in one embodiment, because the second sacrificial layer 208 (referring to FIG. 4) can be made of a photoresist, a process for removing the second sacrificial layer 208 can include a dry etching process and/or a wet etching process. Because the photoresist can be removed easily, the removing of the second sacrificial layer 208 may not easily cause damage to the first work function layer 221 within the second opening 212, or to the cap layer 203 within the third opening 213 and the fourth opening 214. Further, the removing of the second sacrificial layer 208 may not easily generate residues attached thereto.

Figure 6:
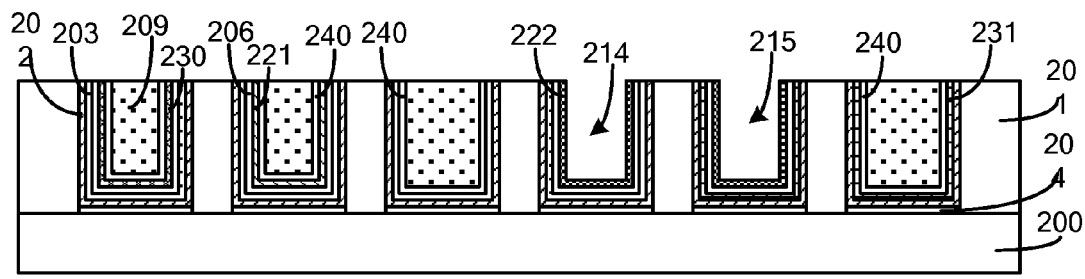

In Step S105 of FIG. 8 and referring to FIG. 6, a second work function layer 222 is formed on the cap layer 203 in the fourth opening 214 and on the surface of the doped cap layer 231 in the fifth opening 215. The second work function layer 222 can have a work function type opposite to the work function type of the first work function layer 221.

In one embodiment, gate structures respectively formed within the fourth opening 214, the fifth opening 215, and the sixth opening 216 can be used for forming NMOS transistors.

Thus, the second work function layer 222 can be made of an N-type work function material. The second work function layer 222 can be made of a material including TaN, Ta, and/or TaAl. The second work function layer 222 can have a thickness ranging from about 5 Å to about 20 Å.

A process for forming the second work function layer 222 can include the following. A third sacrificial layer 209 can be formed in the first opening 211 (as shown in FIG. 5), the second opening 212 (as shown in FIG. 5), the third opening 213 (as shown in FIG. 5), and the sixth opening 216 (as shown in FIG. 5). A second work function film can be deposited on the surface of the third sacrificial layer 209 and the dielectric layer 201, and within the fourth opening 214 and the fifth opening 215. The second work function film on the surface of the third sacrificial layer 209 and the dielectric layer 201 can be removed using a planarization process, to form the second work function layer 222.

A process for forming the second work function film can include a CVD process, a PVD process, and/or an ALD process. The planarization process can include a CMP process, an etch-back process, or any other appropriate polishing processes.

The third sacrificial layer 209 together with the dielectric layer 201 can serve as a mask for forming the second work function layer 222. In one embodiment, the third sacrificial layer 209 can be made of a material including a photoresist. A process for forming the third sacrificial layer 209 can include the following. By using a coating process, a photoresist film can be formed on the surface of the dielectric layer 201 and within the first opening 211, the second opening 212, the third opening 213, the fourth opening 214, the fifth opening 215, and the sixth opening 216. An exposure and developing process can be performed on the photoresist film, to remove the photoresist film within the fourth opening 214 and within the fifth opening 215.

When a photoresist is used as the material of the third sacrificial layer 209, the third sacrificial layer 209 can be formed easily and patterned easily. Further, during the forming of the third sacrificial layer 209 by patterning, damage is not caused to the dielectric layer 201, or to the cap layer 203 or any other appropriate layer within the first opening 211, the second opening 212, the third opening 213, and the sixth opening 216.

In one embodiment, after the annealing process and before the second work function layer 222 is formed, a second barrier layer 240 can be formed in the first opening 211, the second opening 212, the third opening 213, the fourth opening 214, the fifth opening 215, and the sixth opening 216. The second work function layer 222 can be formed on the surface of the second barrier layer 214 in the fourth opening 240 and the fifth opening 215.

In another embodiment, the second barrier layer 240 can be formed only in the fourth opening 214 and the fifth opening 215. The second work function layer 222 can be formed on the surface of the second barrier layer 214 in the fourth opening 240 and the fifth opening 215.

During the removing of the second work function film on the surface of the third sacrificial layer 209 and the dielectric layer 201 using the planarization process, the second barrier layer 240 can serve as a stop layer for the etching process or the polishing process, in order to protect the surface of the dielectric layer 201 from being damaged. Thus, accurate and precise sizes of the gate structures formed in the first opening 211, the second opening 212, the third opening 213, the fourth opening 214, the fifth opening 215, and the sixth opening 216 can be ensured.

The second barrier layer 240 can be made of a material including TaN, Ta, and/or TaAl. The second barrier layer 240 can have a thickness ranging from about 5 Å to about 20 Å. A process for forming the second barrier layer 240 can include a CVD process, a PVD process, and/or an ALD process.

In Step S106 of FIG. 8 and referring to FIG. 7, after the polishing or planarization process, the third sacrificial layer 209 (as shown in FIG. 6) can be removed. After the second work function layer 222 is formed, a third work function layer 223 and a metal gate 224 on the surface of the third work function layer 223 can be (sequentially) formed in the first opening 211 (as shown in FIG. 5), the second opening 212 (as shown in FIG. 5), the third opening 213 (as shown in FIG. 5), the fourth opening 214 (as shown in FIG. 6), the fifth opening 215 (as shown in FIG. 6) and the sixth opening 216 (as shown in FIG. 5). The third work function layer 223 can have a work function type that is the same as the work function type of the first work function layer 221.

The third work function layer 223 can be made of a P-type work function material. For example, the third work function layer 223 can be made of a material including TaC, Ti, Al, $Ti_xAl_{1-x}$, or a combination thereof. The third work function layer 223 can have a thickness ranging from about 10 Å to about 80 Å. A process for forming the third work function layer 223 can include a CVD process, a PVD process, and/or an ALD process. The metal gate 224 can be used as a gate of a PMOS transistor or an NMOS transistor. The metal gate 224 can be made of a material including a metal. In one embodiment, the metal gate 224 can be made of a material including aluminum and/or tungsten.

A process for forming the third work function layer 223 and the metal gate 224 can include the following. A third work function film can be deposited on the surface of the dielectric layer 201, and within the first opening 211, the second opening 212, the third opening 213, the fourth opening 214, the fifth opening 215, and the sixth opening 216. A metal gate film can be deposited on the surface of the third work function film to fill the first opening 211, the second opening 212, the third opening 213, the fourth opening 214, the fifth opening 215, and the sixth opening 216. Both of the third work function film and the metal gate film that are on the surface of the dielectric layer 201 can be removed using a planarization process, to form the third work function layer 223 and the metal gate 224.

A process for forming the third work function film can include a CVD process, a PVD process, and/or an ALD process. The planarization process can include a chemical mechanical polishing (CMP) process, an etch-back process, or any other appropriate polishing processes.

In one embodiment, the third sacrificial layer 209 can be made of a material including a photoresist. A process for removing the third sacrificial layer 209 can include a dry etching process and/or a wet etching process.

The gate structures respectively formed within the first opening 211, the second opening 212, and the third opening 213 can be used for forming PMOS transistors. In the first opening 211, the third work function layer 223 and the cap layer 203 can have the doped work function layer 230 formed there-between. In the second opening 212, the third work function layer 223 and the cap layer 203 can have the first work function layer 221 formed there-between. Because the work function of the doped work function layer 230 can be smaller than the work function of the first work function layer 221, the threshold voltage of the PMOS transistor formed in the first opening 211 can be higher than the threshold voltage of the PMOS transistor formed in the second opening 212.

Further, compared with the third opening 213, the first opening 211 can additionally have a doped work function layer 230. Thus, the work function resulted from the layers in the first opening 211 can be higher than the work function resulted from the layers in the third opening 213. Therefore, the threshold voltage of the PMOS transistor formed in third opening 213 can be higher than the threshold voltage of the PMOS transistor formed in the first opening 211. Therefore, the threshold voltage of the PMOS transistor formed in third opening 213 can be higher than the threshold voltage of the PMOS transistor formed in the first opening 211, and the threshold voltage of the PMOS transistor formed in the first opening 211 can be higher than the threshold voltage of the PMOS transistor formed in the second opening 212.

Moreover, the gate structures respectively formed within the fourth opening 214, the fifth opening 215, and the sixth opening 216 can be used for forming NMOS transistors. In the fourth opening 214, the second work function layer 222 and the gate dielectric layer 202 can have the cap layer 203 formed there-between. In the fifth opening 215, the second work function layer 222 and the gate dielectric layer 202 can have the doped cap layer 231 formed there-between. Because the work function of the doped cap layer 231 can be smaller than the work function of the cap layer 203, the threshold voltage of the NMOS transistor formed in the fourth opening 214 can be higher than the threshold voltage of the NMOS transistor formed in the fifth opening 215.

Further, compared with the sixth opening 216, the fourth opening 214 can additionally have the second work function layer 222. Even though the sixth opening 216 has the doped cap layer 231 formed therein, the doped cap layer 231 is made of a P-type work function material doped with an N-type work function material, so the work function of the doped cap layer 231 can be greater than the work function of the second work function layer 222. Thus, the threshold voltage of the NMOS transistor formed in the sixth opening 216 can be greater than the threshold voltage of the NMOS transistor formed in the fourth opening 214. Therefore, the threshold voltage of the PMOS transistor formed in sixth opening 216 can be higher than the threshold voltage of the PMOS transistor formed in the fourth opening 214, and the threshold voltage of the PMOS transistor formed in the fourth opening 214 can be higher than the threshold voltage of the PMOS transistor formed in the fifth opening 215.

Further, in the sixth opening 216, the third work function layer 223 and the gate dielectric layer 202 can have the doped cap layer 231 there-between. In the third opening 213, the third work function layer 223 and the gate dielectric layer 202 can have the cap layer 203 there-between. In addition, the doped cap layer 231 can have a work function lower than the work function of the cap layer 203. Therefore, the third opening 213 can be used for forming a PMOS transistor, and the sixth opening 216 can be used for forming an NMOS transistor.

During the above-described process for forming the PMOS transistors and the NMOS transistors having different threshold voltages, sacrificial layers made of a material including a photoresist need to be formed and removed for only three times. The sacrificial layers formed and removed for the three times are the first sacrificial layer 205 (as shown in FIG. 3), the second sacrificial layer 208 (as shown in FIG. 4), and the third sacrificial layer 209 (as shown in FIG. 6), respectively. Thus, the process for forming the transistors having various threshold voltages can be simplified. Process time and production cost can be saved.

Moreover, in the first opening 211, the second opening 212, the third opening 213, the fourth opening 214, the fifth opening 215, and the sixth opening 216, at most only two work function layers may need to be formed. Thus, during the formation of the metal gate 224, each of the first opening 211, the second opening 212, the third opening 213, the fourth opening 214, the fifth opening 215, and the sixth opening 216 can be ensured to have a top opening that is sufficiently large, i.e., having a sufficiently small depth to width ratio, which can be favorable for depositing the metal gate film. In addition, the metal gate film formed in the each opening can be dense and uniform, which can help to eliminate voids inside the formed metal gate 224. Thus, the formed transistors can have desired quality and stable performance.

In one embodiment, the first work function layer can be formed on the surface of the cap layer in the first opening and the second opening. The cap layer can have the same work function type as the first work function layer. Further, a diffusion layer can be formed on the surface of the first work function layer in the first opening. Using an annealing process, material of the diffusion layer can be diffused into the first work function layer, to form a doped work function layer. Because the diffusion layer can have a work function type opposite to the first work function layer, a transistor formed using the first opening can have a threshold voltage higher than a threshold voltage of a transistor formed using the second opening.

In the third opening, only a third work function layer is formed between the cap layer and the metal gate. That is, relative to the third opening, the first opening can additionally have a doped work function layer. Thus, a transistor formed using the third opening can have a threshold voltage higher than a threshold voltage of a transistor formed using the first opening. In other words, the transistors formed using the first opening, the second opening, and the third opening can have threshold voltages that are different from each other.

Moreover, the diffusion layer can further be formed on the surface of the cap layer in the fifth opening and the sixth opening. By using the annealing process, the doped cap layer can be formed in the fifth opening and the sixth opening. Because the diffusion layer can have a work function type opposite to the first work function layer, the cap layer can have a work function type opposite to the doped cap layer. Thus, a transistor formed using the fourth opening can have a threshold voltage higher than a threshold voltage of a transistor formed using the fifth opening.

Furthermore, relative to the sixth opening, each of the fourth opening and the fifth opening can additionally have a second work function layer. Therefore, both of transistors formed using the fourth opening and the fifth opening can have threshold voltages lower than the threshold voltage of a transistor formed using the sixth opening. In other words, the transistors formed using the fourth opening, the fifth opening, and the sixth opening can have threshold voltages that are different from each other.

Because only three photolithography-etching processes need to be performed during the forming of the first work function layer, the diffusion layer, and the second work function layer, the process for forming the semiconductor device can be simplified. Further, because at most only three work function layers need to be deposited in the first opening, the second opening, the third opening, the fourth opening, the fifth opening, and the sixth opening, the number of work function layers that need to be deposited in the openings can be sufficiently small. Thus, the process for filling the six openings can be made easier, which can help to prevent gaps or voids from forming in the work function layers and the metal gate in the six openings. Thus, performance and stability of the semiconductor device can be improved.

Further, the first opening, the second opening and the third opening can be used for forming PMOS transistors. In addition, the diffusion layer can be made of a material including TiAl and/or Al. The diffusion layer can be made of an N-type work function material. Therefore, the material of the doped work function layer can be closer to N-type (i.e., more N-type) than the first work function layer. Thus, the threshold voltage of the transistor formed in the first opening can be higher than the threshold voltage of the transistor formed in the second opening.

The fourth opening 214, the fifth opening 215, and the sixth opening 216 can be used for forming NMOS transistors. The diffusion layer can be made of an N-type work function material. Therefore, the work function of the doped cap layer can be lower than the work function of the cap layer. Accordingly, a transistor formed using the sixth opening can be closer to an NMOS transistor (i.e., more N-type) than a transistor formed using the third opening. Further, as a result, the threshold voltage of the NMOS transistor formed in the fifth opening can be lower than the threshold voltage of the NMOS transistor formed in the fourth opening.

Accordingly, various embodiments of the present disclosure also provide a semiconductor device. Still referring to FIG. 7, the semiconductor device can include a substrate 200, and a dielectric layer 201 on the surface of the substrate 200. The dielectric layer 201 can have therein a first opening (not shown), a second opening (not shown), a third opening (not shown), a fourth opening (not shown), a fifth opening (not shown), and a sixth opening (not shown). Sidewalls and bottom surface of each of the first opening, the second opening, the third opening, the fourth opening, the fifth opening, and the sixth opening can have a gate dielectric layer 202 thereon. Transistors formed respectively using the first opening, the second opening, and the third opening can have a type opposite to a type of transistors formed respectively using the fourth opening, the fifth opening, and the sixth opening.

Further, the semiconductor device can include, on the surface of the gate dielectric layer 202 in the first opening, a cap layer 203, a doped work function layer 230 on the surface of the cap layer 203, a third work function layer 223 on the surface of the doped work function layer 230, and a metal gate 224 on the surface of the third work function layer 223. The doped work function layer 230 can have a dopant material therein. The dopant material can have a work function type opposite to a first work function layer 221.

Further, the semiconductor device can include, on the surface of the gate dielectric layer 202 in the second opening, a cap layer 203, a first work function layer 221 on the surface of the cap layer 203, a third work function layer 223 on the surface of the first work function layer 221, and a metal gate 224 on the surface of the third work function layer 223. The cap layer 203 and the third work function layer 223 can have the same work function type as the first work function layer 221.

Further, the semiconductor device can include, on the surface of the gate dielectric layer 202 in the third opening, a cap layer 203, a third work function layer 223 on the surface of the cap layer 203, and a metal gate 224 on the surface of the third work function layer 223.

Further, the semiconductor device can include, on the surface of the gate dielectric layer 202 in the fourth opening, a cap layer 203, a second work function layer 222 on the surface of the cap layer 203, a third work function layer 223 on the surface of second work function layer 222, and a metal gate 224 on the surface of the third work function layer 223. The second work function layer 222 can have a work function type opposite to the work function type of the first work function layer 221.

Further, the semiconductor device can include, on the surface of the gate dielectric layer 202 in the fifth opening, a doped cap layer 231, a second work function layer 222 on the surface of the doped cap layer 231, a third work function layer 223 on the surface of the second work function layer 222, and a metal gate 224 on the surface of the third work function layer 223. The doped cap layer 231 can have the dopant material therein. The dopant material can have a work function type opposite to a first work function layer 221.

Further, the semiconductor device can include, on the surface of the gate dielectric layer 202 in the sixth opening, a doped cap layer 231, a third work function layer 223 on the surface of doped cap layer 231, and a metal gate 224 on the surface of the third work function layer 223.

In one embodiment, because the dopant material can have a work function type opposite to a first work function layer, a threshold voltage of a transistor formed using a first opening having the doped work function layer can be higher than a threshold voltage of a transistor formed using the second opening. In the third opening, the cap layer and the metal gate have only the third work function layer formed there-between. Thus, the threshold voltage of the transistor formed in the third opening can be higher than the threshold voltage of the transistor formed in the first opening. In other words, the transistors formed using the first opening, the second opening, and the third opening can have threshold voltages that are different from each other.

Meanwhile, because the dopant material can have a work function type opposite to the first work function layer, the doped cap layer formed in the fifth opening and the sixth opening can have a work function type opposite to the cap layer. Thus, the threshold voltage of the transistor formed in the fifth opening can be lower than the threshold voltage of the transistor formed in the fourth opening. Further, relative to the sixth opening, each of the fourth opening and the fifth opening can additionally have a second work function layer. In addition, the second work function layer can have a work function type opposite to the first work function layer. Therefore, both of transistors formed using the fourth opening and the fifth opening can have threshold voltages lower than a threshold voltage of a transistor formed using the sixth opening. In other words, the transistors formed using the fourth opening, the fifth opening, and the sixth opening can have threshold voltages that are different from each other.

Because the number of work function layers in the six openings (i.e., the first opening, the second opening, the third opening, the fourth opening, the fifth opening, and the sixth opening) can be sufficiently small, gate structures formed in the six openings can have desired morphology and quality, and can have stable performance.

In certain embodiments, the gate structures respectively formed within the first opening 211, the second opening 212, and the third opening 213 can be used for forming PMOS transistors, and the gate structures respectively formed within the fourth opening 214, the fifth opening 215, and the sixth opening 216 can be used for forming NMOS. However, in other embodiments, the gate structures respectively formed within the first opening 211, the second opening 212, and the third opening 213 can be used for forming NMOS transistors, and the gate structures respectively formed within the fourth opening 214, the fifth opening 215, and the sixth opening 216 can be used for forming PMOS transistors.

In certain embodiments, the first work function layer 221 can be made of a P-type work function material, the diffusion layer 207 can be made of an N-type work function material, the second work function layer 222 can be made of an N-type work function material, and the third work function layer 223 can be made of a P-type work function material. However, in other embodiments, the first work function layer 221 can be made of an N-type work function material, the diffusion layer 207 can be made of a P-type work function material, the second work function layer 222 can be made of a P-type work function material, and the third work function layer 223 can be made of an N-type work function material.

In various embodiments, during comparison of each of the threshold voltages of PMOS transistors respectively formed using the first opening 211, the second opening 212, and the third opening 213, an actual value of each threshold voltage can be used. In other embodiments, an absolute value of each threshold voltage can be used. Whether an actual value or an absolute value is used can depend on need of practical applications of the semiconductor device.

In various embodiments, during comparison of each of the threshold voltages of NMOS transistors respectively formed using the fourth opening 214, the fifth opening 215, and the sixth opening 216, an actual value of each threshold voltage can be used. In other embodiments, an absolute value of each threshold voltage can be used. Whether an actual value or an absolute value is used can depend on need of practical applications of the semiconductor device.

In one exemplary method for forming a semiconductor device according to various embodiments, a new integration scheme or method for manufacturing transistors having gate structures with multiple work functions is provided. The exemplary method can be used, e.g., in a beyond 20 nm high-k and metal gate last process.

A substrate 200 can be provided. A surface of the substrate 200 can have a dielectric layer 201 formed thereon. The dielectric layer 201 can have six openings formed therein, including a first opening 211, a second opening 212, a third opening 213, a fourth opening 214, a fifth opening 215, and a sixth opening 216. A bonding layer 204 can further be formed in the six openings. The bonding layer 204 can also be referred to as an interlayer (IL) layer.

An 'opening' can also be referred to as a 'metal gate trench'. Each opening can be formed by removing a dummy gate structure that is previously formed on the substrate 200. The dummy gate structure can include a dummy gate dielectric layer on the surface of the substrate 200, and a dummy gate layer on a surface of the dummy gate dielectric layer. The dummy gate layer can be made of polysilicon. The dummy gate dielectric layer can be made of a material including silicon oxide.

A 'threshold voltage' can also be referred to as 'Vt'. The first opening 211 can be used for forming a standard-threshold-voltage PMOS (or standard Vt PMOS, or SVT PMOS) transistor. The second opening 212 can be used for forming an ultra-low-threshold-voltage PMOS (or ultra-low-Vt PMOS, or ULV PMOS) transistor. The third opening 213 can be used for forming an ultra-high-threshold-voltage PMOS (or ultra-high-Vt PMOS, or UHV PMOS) transistor. The fourth opening 214 can be used for forming a standard-threshold-voltage NMOS (or standard Vt NMOS, or SVT NMOS) transistor. The fifth opening 215 can be used for forming an ultra-low-threshold-voltage NMOS (or ultra-low-Vt PMOS, or ULV NMOS) transistor. The sixth opening 216 can be used for forming an ultra-high-threshold-voltage NMOS (or ultra-high-Vt PMOS, or UHV NMOS) transistor.

In each of the six openings, a gate dielectric layer 202 made of a high-K dielectric material can be deposited. A cap layer 203 can be deposited on the gate dielectric layer 202 in each of the six openings.

A first sacrificial layer 205 can be formed to fill the six openings. A photoresist can be coated on the first sacrificial layer 205. A first photolithography process can be used to pattern the photoresist to expose positions corresponding to the first opening 211 (for SVT PMOS transistor) and the second opening 212 (for ULV PMOS transistor). The first sacrificial layer 205 at the positions corresponding to the first opening 211 (for SVT PMOS transistor) and the second opening 212 (for ULV PMOS transistor) can then be removed by dry etch and/or wet etch. The photoresist can then be stripped.

A P-type work function layer (i.e., PMOS work function tuning layer, or first work function layer 221) can be formed in the first opening 211 (for SVT PMOS transistor) and the second opening 212 (for ULV PMOS transistor), e.g., as shown in FIG. 3. The first sacrificial layer 205 can then be stripped.

Optionally, before the forming of the P-type work function layer, a first barrier layer 206 can be formed in the first opening 211 and the second opening 212. In that case, the P-type work function layer can be formed on the first barrier layer 206 in the first opening 211 and the second opening 212.

A second sacrificial layer 208 can be formed to fill the six openings. A photoresist can be coated on the second sacrificial layer 208. A second photolithography process can be used to pattern the photoresist to expose positions corresponding to the first opening 211 (for SVT PMOS transistor), the fifth opening 215 (for ULV NMOS transistor), and the sixth opening 216 (for UHV NMOS transistor). The second sacrificial layer 208 at the positions corresponding to the first opening 211 (for SVT PMOS transistor), the fifth opening 215 (for ULV NMOS transistor), and the sixth opening 216 (for UHV NMOS transistor) can then be removed by dry etch and/or wet etch. The photoresist can then be stripped.

A diffusion layer 207 can be formed in the first opening 211 (for SVT PMOS transistor), the fifth opening 215 (for ULV NMOS transistor), and the sixth opening 216 (for UHV NMOS transistor), e.g., as shown in FIG. 4. The diffusion layer 207 can be made of Al, and can also be referred to as an Al diffusion buffer layer.

An annealing process can be performed to diffuse Al from the diffusion layer 207 into the first work function layer 221 in the first opening 211, and into the cap layer 203 in the fifth opening 215 and the sixth opening 216. Thus, a doped work function layer 230, also referred to as a lower P-type work function layer, can be formed in the first opening 211. A doped cover layer 231, also referred to as a lower work function cap layer, can be formed in the fifth opening 215 and the sixth opening 216. The annealing process can be performed for a time duration ranging from about 10 seconds to about 30 seconds, at a temperature (i.e., an annealing temperature) ranging from about 500° C. to about 800° C., and in a gas including nitrogen.

A remaining portion of the diffusion layer 207 can then be removed by dry etch and/or wet etch. The second sacrificial layer 208 can be stripped off, e.g., as shown in FIG. 5. A second barrier layer 240 can then be formed in the first opening 211, the second opening 212, the third opening 213, the fourth opening 214, the fifth opening 215, and the sixth opening 216.

A third sacrificial layer 209 can be formed to fill the six openings. A photoresist can be coated on the third sacrificial layer 209. A third photolithography process can be used to pattern the photoresist to expose positions corresponding to the fourth opening 214 (for the SVT NMOS transistor) and the fifth opening 215 (for the ULV NMOS transistor). The third sacrificial layer 209 at the positions corresponding to the fourth opening 214 (for the SVT NMOS transistor) and the fifth opening 215 (for the ULV NMOS transistor) can then be removed by dry etch and/or wet etch. The photoresist can then be stripped.

An N-type work function layer (i.e., NMOS work function tuning layer or second work function layer 222) can be formed in the fourth opening 214 (for the SVT NMOS transistor) and the fifth opening 215 (for the ULV NMOS transistor), e.g., as shown in FIG. 6.

The third sacrificial layer 209 can then be stripped. A mid-gap work function layer (i.e., a third work function layer 223) can be formed in each of the six openings. A metal gate 224 can be formed to fill the each of the six openings, e.g., as shown in FIG. 7.

In the device manufactured using the above exemplary method(s), the second opening 212 can have a P-type work function layer, i.e., a purely P-type work function layer. The ULV PMOS transistor formed using the second opening 212 can have the lowest threshold voltage.

The first opening 211 can have a P-type work function layer having Al diffused there-into. The SVT PMOS transistor formed using the first opening 211 can have a higher Vt than the ULV PMOS transistor.

The third opening 213 can have a mid-gap work function layer. The UHV PMOS transistor formed using the first opening 211 can have the highest Vt among the ULV PMOS transistor, the SVT PMOS transistor, and the UHV PMOS transistor. The Vt can be tuned via a lightly-doped-drain (LDD) process and/or a pocket implantation process.

Further, in the device manufactured using the above exemplary method, the fifth opening 215 can have a cap layer with Al diffused there-into and an N-type work function layer. The ULV NMOS transistor formed using the fifth opening 215 can have the lowest threshold voltage Vt.

The fourth opening 214 can have an N-type work function layer. The SVT NMOS transistor formed using the fourth opening 214 can have a higher Vt than the ULV NMOS transistor.

The sixth opening 216 can have a mid-gap work function layer and a cap layer with Al diffused there-into. The UHV NMOS transistor formed using the sixth opening 216 can have the highest Vt among the ULV NMOS transistor, the SVT NMOS transistor, and the UHV NMOS transistor. The Vt can be tuned via a lightly-doped-drain (LDD) process and/or a pocket implantation process.

Thus, only three photolithography processes may be needed for forming the device. Film stacking can be simple, and metal gate gap filling issue can be avoided. The device can be used for forming planar transistors or fin field effect transistors (FinFETs).

Optionally, the bonding layer 204 (the IL layer) can be made of a material including thermal oxide (or thermally-grown silicon oxide), nitrogen oxide (or silicon oxynitride), chemical oxide, or any other appropriate films. The bonding layer 204 can have a thickness ranging from about 5 Å to about 10 Å. A process for forming the bonding layer 204 can include a CVD process, a PVD process, or an ALD process.

Optionally, the gate dielectric layer 202 can be made of LaO, AlO, BaZrO, HfZrO, HfZrON, HfLaO, HfSiO, HfSiON, LaSiO, AlSiO, HfTaO, HfTiO, $(Ba,Sr)TiO_3$(BST), $Al_2O_3$, $Si_3N_4$, oxynitride, or any other appropriate films. The gate dielectric layer 202 can have a thickness ranging from about 10 Å to about 30 Å. A process for forming the gate dielectric layer 202 can include a CVD process, a PVD process, and/or an ALD process.

Optionally, the cap layer 203 can be made of a material including $La_2O_3$, $AL_2O_3$, $Ga_2O_3$, $In_2O_3$, MoO, Pt, Ru, TaCNO, Ir, TaC, MoN, WN, $Ti_xN_{1-x}$ or any other appropriate films. The cap layer 203 can have a thickness ranging from about 5 Å to about 20 Å. A process for forming the cap layer 203 can include a CVD process, a PVD process, and/or an ALD process.

Optionally, one or both of the first barrier layer 206 and the second barrier layer 240 can be made of a material including TaN, Ta, TaAl, or any other appropriate films, can have a thickness ranging from about 5 Å to about 20 Å, and can be formed using a CVD process, a PVD process, and/or an ALD process.

Optionally, the second work function layer 222 can be made of a material including TaC, Ti, Al, $Ti_xAl_{1-x}$, or any other appropriate films, can have a thickness ranging from about 10 Å to about 80 Å, and can be formed using a CVD process, a PVD process, and/or an ALD process.

Optionally, the metal gate 224 can be made of aluminum, tungsten, or any other appropriate films, and can be formed using a CVD process, a PVD process, and/or an ALD process. The metal gate 224 can be formed using a process such that the metal gate 224 can be free of voids.

Optionally, the diffusion layer 207 can be made of a material including TiAl, Al, or any other appropriate films. The diffusion layer 207 can have a thickness ranging from about 5 Å to about 30 Å. A process for forming the diffusion film can include a CVD process, a PVD process, and/or an ALD process.

Optionally, the first work function layer 221 and the diffusion layer 207 can be removed using a wet etch or dry etch process, such that the process can have a sufficiently high selectivity between the first work function layer 221 and the first barrier layer 206 underneath.

Optionally, the material of the first sacrificial layer, the second sacrificial layer, and the third sacrificial layer can ensure desired gap filling performance and be easier to remove by a strip process. The strip process can use a dry etch or a wet etch process.

As used herein, relational terms such as 'first' and 'second' are merely used for differentiate one element or operation from another element or operation, and do not require or imply that any actual relationship or order as such exist between these elements or operations. In addition, the terms "include", "comprise", "contain", or any other variations thereof, are intended to cover a non-exclusive inclusion, such that a process, method, article, or apparatus that includes a series of elements can not only include those elements, but also include other elements not expressly listed, or inherent elements for such a process, method, article, or apparatus. Without further limitation, an element defined by a statement "include one . . . " does not exclude additional identical elements that may be included in the process, method, article, or apparatus that includes the element.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:
    providing a substrate;
    forming a dielectric layer on the substrate, the dielectric layer having therein six openings including a first opening, a second opening, a third opening, a fourth opening, a fifth opening, and a sixth opening;
    forming a gate dielectric layer on sidewalls and a bottom surface of each opening of the six openings;
    forming a cap layer on the gate dielectric layer;
    forming a first work function layer on the cap layer in the first opening and in the second opening;
    forming a diffusion layer on the first work function layer in the first opening, and on the cap layer in both of the fifth opening and the six opening;
    performing an annealing process to diffuse a material of the diffusion layer into the first work function layer and the cap layer, to form a doped work function layer in the first opening and form a doped cap layer in the fifth opening and in the sixth opening;
    removing a remaining portion of the diffusion layer after the annealing process, and forming a second work function layer on the cap layer in the fourth opening and on the doped cap layer in the fifth opening, such that transistors respectively formed with the first opening, the second opening, and the third opening have threshold voltages different from each other, and transistors respectively formed with the fourth opening, the fifth opening, and the sixth opening have threshold voltages different from each other; and
    after forming the second work function layer, forming a third work function layer in the each opening; and
    forming a metal gate on the third work function layer.

2. The method according to claim 1, wherein:
    the transistors formed with the first opening, the second opening, and the third opening having a type opposite to the transistors formed with the fourth opening, the fifth opening, and the sixth opening;
    the cap layer has a same work function type as the first work function layer;
    the diffusion layer has a work function type opposite to the first work function layer;
    the second work function layer has a work function type opposite to the first work function layer; and
    the third work function layer has a same work function type as the first work function layer.

3. The method according to claim 1, wherein:
    the first work function layer is made of a P-type work function material;
    the third work function layer is made of a P-type work function material;
    the diffusion layer is made of a material including TiAl, Al, or a combination thereof;
    the diffusion layer has a thickness ranging from about 5 Å to about 30 Å;
    the diffusion layer is formed using a chemical vapor deposition (CVD) process, a physical vapor deposition (PVD) process, or an atomic layer deposition (ALD) process; and
    the remaining portion of diffusion layer is removed by a dry etching process or a wet etching process.

4. The method according to claim 3, wherein:
    a gate structure of a PMOS transistor is formed in each opening of the first opening, the second opening, and the third opening; and
    a gate structure of an NMOS transistor is formed in each opening of the fourth opening, the fifth opening, and the sixth opening.

5. The method according to claim 1, wherein the annealing process is performed for a time duration ranging from about 10 seconds to about 30 seconds, at a temperature ranging from about 500° C. to about 800° C., and using a gas including nitrogen.

6. The method according to claim 1, wherein the forming of the first work function layer includes:
   forming a first sacrificial layer in the third opening, the fourth opening, the fifth opening, and the sixth opening, the first sacrificial layer being made of a photoresist;
   depositing a first work function film on the first sacrificial layer and on the dielectric layer, and in the first opening and in the second opening;
   removing the first work function film on the first sacrificial layer and on the dielectric layer using a planarization process, to form the first work function layer; and
   after the planarization process, removing the first sacrificial layer using a dry etching process or a wet etching process.

7. The method according to claim 1, wherein the forming of the diffusion layer includes:
   forming a second sacrificial layer in the second opening, the third opening, and the fourth opening, the second sacrificial layer being made of a photoresist;
   depositing a diffusion film on the second sacrificial layer and on the dielectric layer, and within the first opening, the fifth opening, and the sixth opening;
   removing the diffusion film on the second sacrificial layer and on the dielectric layer using a planarization process, to form the diffusion layer; and
   after the planarization process, removing the second sacrificial layer using a dry etching process or a wet etching process.

8. The method according to claim 1, wherein the forming of the second work function layer includes:
   forming a third sacrificial layer in the first opening, the second opening, the third opening, and the sixth opening, the third sacrificial layer being made of a photoresist;
   depositing a second work function film on the third sacrificial layer and on the dielectric layer, and within the fourth opening and the fifth opening;
   removing the second work function film on the third sacrificial layer and on the dielectric layer using a planarization process, to form the second work function layer; and
   after the planarization process, removing the third sacrificial layer using a dry etching process or a wet etching process.

9. The method according to claim 1, wherein, before forming the first work function layer, the method further includes:
   forming a first barrier layer on the cap layer within the first opening and the second opening, the first work function layer being formed on the first barrier layer in the first opening and in the second opening.

10. The method according to claim 9, wherein:
   the first barrier layer is made of a material including TaN, Ta, TaAl, or a combination thereof;
   the first barrier layer has a thickness ranging from about 5 Å to about 20 Å; and
   the first barrier layer is formed by a CVD process, a PVD process, or an ALD process.

11. The method according to claim 1, wherein, before forming the second work function layer, the method further includes:
   forming a second barrier layer in the first opening, the second opening, the third opening, the fourth opening, the fifth opening, and the sixth opening, the second work function layer being formed on the second barrier layer in the fourth opening and the fifth opening.

12. The method according to claim 11, wherein:
   the second barrier layer is made of a material including TaN, Ta, TaAl, or a combination thereof;
   the second barrier layer has a thickness ranging from about 5 Å to about 20 Å; and
   the second barrier layer is formed using a CVD process, a PVD process, or an ALD process.

13. The method according to claim 1, further including forming a bonding layer between the gate dielectric layer and the substrate, the bonding layer being made of a material including silicon oxide, silicon oxynitride, or a combination thereof, having a thickness ranging from about 5 Å to about 10 Å, and being formed using a thermal oxidation process, a chemical oxidation process, a CVD process, a PVD process, or an ALD process.

14. The method according to claim 1, wherein:
   the gate dielectric layer is made of a high-K dielectric material including $La_2O_3$, $Al_2O_3$, BaZrO, $HfZrO_4$, HfZrON, HfLaO, HfSiO, HfSiON, LaSiO, AlSiO, HfTaO, HfTiO, $(Ba,Sr)TiO_3$, $Si_3N_4$, or a combination thereof;
   the gate dielectric layer has a thickness ranging from about 10 Å to about 30 Å; and
   the gate dielectric layer is formed by a CVD process, a PVD process, or an ALD process.

15. The method according to claim 1, wherein:
   the cap layer is made of a material including $La_2O_3$, $AL_2O_3$, $Ga_2O_3$, $In_2O_3$, MoO, Pt, Ru, TaCNO, Ir, TaC, MoN, WN, $Ti_xN_{1-x}$, or a combination thereof;
   the cap layer has a thickness ranging from about 5 Å to about 20 Å; and
   the cap layer is formed by a CVD process, a PVD process, or an ALD process.

16. The method according to claim 1, wherein:
   the first work function layer is made of a material including $Ti_xN_{1-x}$, TaC, MoN, TaN, or a combination thereof, has a thickness ranging from about 10 Å to about 580 Å, and is formed using a CVD process, a PVD process, or an ALD process;
   the second work function layer is made of a material including TaN, Ta, TaAl, or a combination thereof, has a thickness ranging from about 5 Å to about 20 Å, and is formed using a CVD process, a PVD process, or an ALD process; and
   the third work function layer is made of a material including TaC, Ti, Al, $Ti_xAl_{1-x}$, or a combination thereof, has a thickness ranging from about 10 Å to about 80 Å, and is forming using a CVD process, a PVD process, or an ALD process.

17. The method according to claim 1, wherein:
   the substrate includes a planar base, wherein the dielectric layer and the six openings are located on a surface of the planar base; or
   the substrate includes:
      a base;
      a plurality of fins located on a surface of the base; and
      an insulating layer located on the base and covering a portion of a sidewall of each fin of the plurality of fins, the dielectric layer being located on the insulating layer and on the sidewall and a top surface of the each fin, the each opening of the six openings covering across a fin of the plurality of fins, and exposing the top surface of the fin and a portion of the sidewall of the fin.

18. A semiconductor device, comprising:
a substrate;

a dielectric layer on the substrate, the dielectric layer having therein six openings including a first opening, a second opening, a third opening, a fourth opening, a fifth opening, and a sixth opening;

a gate dielectric layer on sidewalls and a bottom surface of each opening of the six openings;

within the first opening, a cap layer on the gate dielectric layer, a doped work function layer on the cap layer, and a third work function layer on the doped work function layer, wherein the doped work function layer has a dopant material therein;

within the second opening, the cap layer on the gate dielectric layer, a first work function layer on the cap layer, and the third work function layer on the first work function layer;

within the third opening, the cap layer on the gate dielectric layer, and the third work function layer on the cap layer, such that transistors respectively formed with the first opening, the second opening, and the third opening have threshold voltages different from each other;

within the fourth opening, the cap layer on the gate dielectric layer, a second work function layer on the cap layer, and the third work function layer on the second work function layer;

within the fifth opening, a doped cap layer on the gate dielectric layer, the second work function layer on the doped cap layer, and the third work function layer on the second work function layer, wherein the doped cap layer has the dopant material therein;

within the sixth opening, the doped cap layer on the gate dielectric layer, and the third work function layer on the doped cap layer, such that transistors respectively formed with the fourth opening, the fifth opening, and the sixth opening have threshold voltages different from each other; and a metal gate filling the each opening of the six openings.

19. The device according to claim 18, wherein:

the transistors formed with the first opening, the second opening, and the third opening have a type opposite to the transistors formed with the fourth opening, the fifth opening, and the sixth opening;

the dopant material has a work function type opposite to the first work function layer;

both of the cap layer and the third work function layer have a same work function type as the first work function layer; and the second work function layer has a work function type opposite to the first work function layer.

20. The device according to claim 18, further including a source and a drain in the substrate respectively located at both sides of the each opening, wherein:

a gate structure of a PMOS transistor is formed in each opening of the first opening, the second opening, and the third opening; and a gate structure of an NMOS transistor is formed in each opening of the fourth opening, the fifth opening, and the sixth opening.

* * * * *